United States Patent
Lin et al.

(10) Patent No.: US 10,073,424 B2
(45) Date of Patent: Sep. 11, 2018

(54) INTELLIGENT 3D PRINTING THROUGH OPTIMIZATION OF 3D PRINT PARAMETERS

(71) Applicant: Autodesk, Inc., San Rafael, CA (US)

(72) Inventors: Pierre Pascal Anatole Lin, London (GB); Karl Willis, Millbrae, CA (US); Eric Jamesson Wilhelm, Oakland, CA (US); Arian Aziz Aghababaie, London (GB)

(73) Assignee: Autodesk, Inc., San Rafael, CA (US)

( * ) Notice: Subject to any disclaimer, the term of this patent is extended or adjusted under 35 U.S.C. 154(b) by 429 days.

(21) Appl. No.: 14/711,714

(22) Filed: May 13, 2015

(65) Prior Publication Data

US 2015/0331402 A1    Nov. 19, 2015

Related U.S. Application Data

(60) Provisional application No. 61/992,600, filed on May 13, 2014.

(51) Int. Cl.
| | |
|---|---|
| *G06F 17/50* | (2006.01) |
| *G05B 15/02* | (2006.01) |
| *B33Y 50/02* | (2015.01) |
| *G05B 19/4099* | (2006.01) |

(52) U.S. Cl.
CPC .............. *G05B 15/02* (2013.01); *B33Y 50/02* (2014.12); *G05B 19/4099* (2013.01); *G06F 17/5009* (2013.01); *G05B 2219/45167* (2013.01); *G05B 2219/49023* (2013.01)

(58) Field of Classification Search
CPC ................ G05B 15/02; G05B 19/4099; G05B 2219/45167; G05B 2219/49023; B33Y 50/02

USPC ........................................................ 700/119
See application file for complete search history.

(56) References Cited

U.S. PATENT DOCUMENTS

| | | | |
|---|---|---|---|
| 5,137,662 A | 8/1992 | Hull et al. | |
| 9,120,270 B2 | 9/2015 | Chen et al. | |
| 9,205,601 B2 | 12/2015 | DeSimone et al. | |
| 9,211,678 B2 | 12/2015 | DeSimone et al. | |

(Continued)

FOREIGN PATENT DOCUMENTS

WO    WO 2014/126830    8/2014

OTHER PUBLICATIONS

Dendukuri et al., "Continuous-flow lithography for high-throughput microparticle synthesis," Nature Materials, vol. 5, May 2006, pp. 365-369, © 2006 Nature Publishing Group.

(Continued)

*Primary Examiner* — Christopher E Everett
*Assistant Examiner* — Michael W Choi
(74) *Attorney, Agent, or Firm* — Fish & Richardson P.C.

(57) ABSTRACT

Methods, systems, and apparatus, including medium-encoded computer program products, for improving 3D printing systems and techniques include, in one aspect, a system including: three dimensional (3D) printer hardware; and at least one computer communicatively coupled with the 3D printer hardware, the at least one computer programed to receive 3D print type inputs for an object to be 3D printed and create a 3D print profile including parameters for 3D printing the object using the 3D printer hardware by matching the 3D print type inputs against a database.

16 Claims, 5 Drawing Sheets

(56) References Cited

U.S. PATENT DOCUMENTS

| | | | |
|---|---|---|---|
| 9,216,546 B2 | 12/2015 | DeSimone et al. | |
| 9,360,757 B2 | 6/2016 | DeSimone et al. | |
| 2006/0156978 A1* | 7/2006 | Lipson | B29C 67/0055 118/708 |
| 2007/0264481 A1 | 11/2007 | DeSimone et al. | |
| 2010/0028994 A1 | 2/2010 | DeSimone et al. | |
| 2011/0182805 A1 | 7/2011 | DeSimone et al. | |
| 2012/0027285 A1* | 2/2012 | Shlain | G06K 9/6256 382/149 |
| 2012/0113457 A1* | 5/2012 | Pettis | G06F 3/12 358/1.14 |
| 2013/0252178 A1 | 9/2013 | McLeod et al. | |
| 2013/0336884 A1 | 12/2013 | DeSimone et al. | |
| 2014/0107925 A1* | 4/2014 | Chang | G06Q 90/00 702/3 |
| 2014/0228860 A1* | 8/2014 | Steines | A61F 2/30942 606/130 |
| 2014/0339741 A1 | 11/2014 | Aghababaie et al. | |
| 2015/0036174 A1* | 2/2015 | Pettis | G06F 3/1288 358/1.15 |
| 2015/0057982 A1* | 2/2015 | Erdman | G06F 17/50 703/1 |
| 2015/0072293 A1 | 3/2015 | DeSimone et al. | |
| 2015/0079327 A1* | 3/2015 | Kautz | B29C 67/0088 428/64.1 |
| 2015/0097315 A1 | 4/2015 | DeSimone et al. | |
| 2015/0097316 A1 | 4/2015 | DeSimone et al. | |
| 2015/0102532 A1 | 4/2015 | DeSimone et al. | |
| 2015/0251356 A1* | 9/2015 | Batchelder | B29C 67/0088 700/98 |
| 2015/0328839 A1 | 11/2015 | Willis et al. | |
| 2015/0360419 A1 | 12/2015 | Willis et al. | |
| 2016/0067921 A1 | 3/2016 | Willis et al. | |

OTHER PUBLICATIONS

Lambert et al., "Design considerations for mask projection microstereolithography systems," (Jun. 22, 2016) [online] (retrieved from http://sffsymposium.engr.utexas.edu/Manuscripts/2013/2013-09-Lambert.pdf), 20 pages.

Massey, "Permeability Properties of Plastics and Elastomers—A Guide to Packaging and Barrier Materials," Published Jan. 1, 2003. pp. 1-5, 19-29.

Pan et al., "Rapid manufacturing in minutes: the development of a mask projection stereolithography process for high-speed fabrication," Proceedings of the ASME 2012 International Manufacturing Science and Engineering Conferences, Jun. 4-8, 2012, Notre Dame, Indiana, US, 10 pages.

Pinnau and Toy, "Gas and vapor properties of amorphous perfluorinated copolymer membranes based on 2,2-bistrifluoromethyl-4,5-difluoro-1,3-dioxole/tetrafluoroethylene," Journal of Membrane Science, 109:125-133 (1996).

Unknown author, "Teflon™ AF amorphous fluoroplastic resins," (Jun. 22, 2016) [online] (retrieved from https://www.chemours.com/Teflon_Industrial/en_US/assets/downloads/teflon-af-product-information.pdf), 3 pages.

Unknown author, "DuPont™ Teflon® AF amorphous fluoroplastic resin," (Jun. 22, 2016) [online] (retrieved from http://www2.dupont.com/Teflon_Industrial/en_US/assets/downloads/h44587.pdf), 4 pages.

Zhang, "Teflon AF composite materials in membrane separation and molecular recognition in fluorous media," Ph.D. dissertation, University of Pittsburgh, Nov. 2013, 207 pages.

\* cited by examiner

INTELLIGENT 3D PRINTING THROUGH OPTIMIZATION OF 3D PRINT PARAMETERS

CROSS-REFERENCE TO RELATED APPLICATIONS

This application claims the benefit under 35 U.S.C. § 119(e) of U.S. patent application Ser. No. 61/992,600 entitled "Intelligent 3D Printing Through Optimization of 3D Print Parameters", filed May 13, 2014, which is incorporated herein by reference in its entirety.

BACKGROUND

This specification relates to three dimensional (3D) printing systems and techniques, also known as, additive manufacturing.

The selection of 3D print parameters across all 3D printing techniques, for example extrusion temperature for Fused Deposition Modelling (FDM) or exposure pattern for Stereolithography (SLA), is often critical to the success or failure of a print. 3D print parameters are typically specific to the 3D printing technique, 3D geometry, material and application and therefore can vary greatly from user to user.

Nonoptimized 3D print parameters can lead to 3D prints taking longer than necessary and producing lower quality parts than the 3D printer is capable of. In addition, it can lead to an increased instance of failures, machine downtime and machine maintenance. This contributes to increased running costs through material wastage and extra maintenance hours and a reduction in throughput due to machine downtime and unproductive print hours.

SUMMARY

This specification describes technologies relating to 3D printing systems and techniques, also known as, additive manufacturing.

In general, one or more aspects of the subject matter described in this specification can be embodied in one or more methods that include: receiving three dimensional (3D) print type inputs for an object to be 3D printed; creating a 3D print profile including parameters for 3D printing the object using 3D printer hardware by matching the 3D print type inputs against a database; and outputting the 3D print profile for use in 3D printing the object using the 3D printer hardware. The receiving can include receiving the 3D print type inputs including user selected critical features of a 3D model of the object and material properties of the object to be 3D printed.

The method can include dynamically altering the parameters of the 3D print profile while 3D printing the object using the 3D printer hardware responsive to data received from one or more sensors in the 3D printer hardware arranged in a closed-loop feedback configuration with a 3D print engine. The creating can include adding to the 3D print profile multiple different sets of two or more 3D print parameters, and the altering can include switching between respective ones of the different sets of two or more 3D print parameters during 3D printing of a single object using the 3D printer hardware. The method can include monitoring 3D print progress during the 3D printing by collecting and processing key indicators using the one or more sensors in the 3D printer hardware. For example, the key indicators can include: ambient machine temperature, part temperature and raw material temperature; compressive stress, tensile stress, shear stress, bending stress and torsional stress; visual indicators captured via one or more cameras; and audible indicators captured via one or more microphones.

The creating can include performing model analytics to optimize the parameters in the 3D print profile using simulation of the 3D printing and analysis of previous simulation data retrieved from a database for prior 3D prints having corresponding 3D print type inputs. The database can include both a local component and a remote component, and the method can include sharing data between the local database component and the remote database component across a network such that actions taken by an experienced user at one location can be used to improve the 3D print profile generated for a different user at a different location. Moreover, the creating can include performing database analysis by cross referencing the 3D print type inputs in the database, which contains previous 3D geometries, simulations, 3D print profiles and user feedback on the success or failure of previous 3D prints, such that the parameters for 3D printing are optimized based on historic data.

The method can include selecting a type of the simulation based on the 3D print type inputs. The type of the simulation can be selected from a group including finite element analysis, computational fluid dynamics, and support generation. In addition, the method can include: performing model analytics and fault analysis, where the fault analysis employs one or more machine learning algorithms to analyze a database for trends that link outcomes of 3D prints with specific 3D geometries, 3D print profiles, materials or applications; obtaining user input regarding success or failure of 3D printing and quality; and using the user input regarding success or failure as feedback to the fault analysis and the model analytics.

One or more aspects of the subject matter described in this specification can also be embodied in one or more systems that include: three dimensional (3D) printer hardware; and at least one computer communicatively coupled with the 3D printer hardware, the at least one computer programed to receive 3D print type inputs for an object to be 3D printed and create a 3D print profile including parameters for 3D printing the object using the 3D printer hardware by matching the 3D print type inputs against a database. The 3D printer hardware can include one or more embedded sensors and an onboard computer arranged in a closed-loop feedback configuration with a 3D print engine to dynamically alter 3D print parameters to optimize a 3D print on the fly.

The at least one computer can be programed to perform model analytics to optimize the parameters in the 3D print profile using simulation of the 3D printing and analysis of previous simulation data retrieved from a database for prior 3D prints having corresponding 3D print type inputs. The 3D print type inputs can include 3D geometry, a 3D printing technique, a material of the 3D printing, and an application. Moreover, the at least one computer can be programed to perform database analysis by cross referencing the 3D print type inputs in the database, which contains previous 3D geometries, simulations, 3D print profiles and user feedback on the success or failure of previous 3D prints, such that the parameters for 3D printing are optimized based on historic data.

The at least one computer can be programed to select a type of the simulation based on the 3D print type inputs. The type of the simulation can be selected from a group including finite element analysis, computational fluid dynamics, and support generation. The at least one computer can be programed to perform model analytics and fault analysis, where the fault analysis employs one or more machine learning algorithms to analyze a database for trends that link outcomes of 3D prints with specific 3D geometries, 3D print profiles, materials or applications, and where user feedback regarding success or failure of 3D printing and quality thereof are solicited and used as feedback to the fault analysis and the model analytics. In addition, the at least one computer can be an onboard computer of the 3D printer hardware.

Particular embodiments of the subject matter described in this specification can be implemented to realize one or more of the following advantages. The productive use of 3D printers need not be restricted to users that have the experience to select 3D print parameters, the resources to cope with unscheduled maintenance and machine downtime, and the patience in the face of repeated failure. This can facilitate the adoption of 3D printing technology in consumer and Small and Medium Enterprise (SME) markets where resources, experience and patience are limited. By addressing the issue of selecting the optimized 3D print parameters for the 3D printing technique, geometry, material and application, the systems and techniques described herein can result in increased print success rate by selection of correct 3D print parameters and detection of print failures, higher quality and faster 3D prints by optimizing the 3D print parameters, reduction in machine downtime by detecting print failures before they become major maintenance events, and/or improved user experience by simplifying the 3D printing process. Moreover, by enabling the selection of optimized 3D print parameters without the traditional trial and error approach, waste of the 3D printing materials and also of the user's time can be reduced.

The details of one or more embodiments of the subject matter described in this specification are set forth in the accompanying drawings and the description below. Other features, aspects, and advantages of the invention will become apparent from the description, the drawings, and the claims.

DETAILED DESCRIPTION

Figure 1:
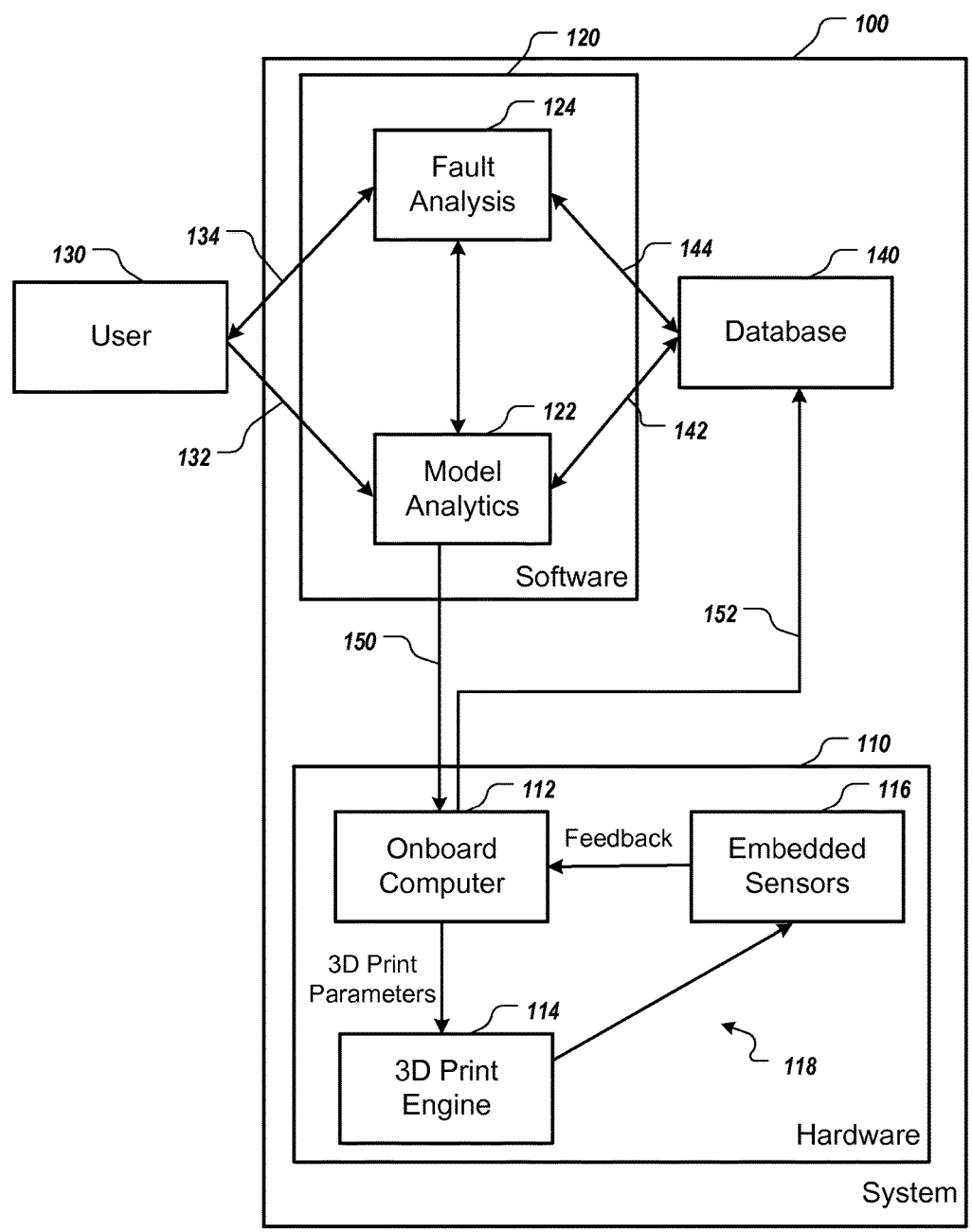
FIG. 1 shows an example of a 3D printing system to perform intelligent 3D printing through optimization of 3D print parameters.

FIG. 1 shows an example of a 3D printing system 100 to perform intelligent 3D printing through optimization of 3D print parameters. The 3D printing system 100 includes 3D printer hardware 110 and software 120, which can be local to the 3D printer hardware 110 (e.g., the software 120 can run in an onboard computer 112 of the 3D printer hardware 110), remote from the 3D printer hardware 110 (e.g., the software 120 can run on a computer that is in a different locale and be communicatively coupled with the 3D printer hardware 110 through the Internet), or both. The 3D printer hardware 110 can include one or more embedded sensors 116 that operate in a closed-loop feedback configuration 118 with the onboard computer 112 and a 3D print engine 114.

The embedded sensor(s) 116 in the 3D printer can monitor print progress and collect data on a number of key indicators, such as ambient machine, part and raw material temperatures, compressive, tensile, shear, bending and torsional stresses, visual indicators captured via cameras and audible indicators captured via microphones. These indicators are applicable to most, if not all, 3D printing techniques. On the other hand, certain 3D printing techniques can have monitoring of key indicators specific to the respective 3D printing techniques. For example, in stereolithography, oxygen content in the photopolymer resin can be a key indicator. Such feedback from the embedded sensor(s) 116 can be provided to the onboard computer 112, which can in turn adjust 3D print parameters that control the 3D print engine 114, as it prints a 3D object. Thus, the closed-loop feedback configuration 118 can compare sensor output to the 3D print profile and dynamically alter the 3D print parameters to optimize the 3D print on the fly.

The software 120 includes a model analytics component 122 that receives input 132 from a user 130 and creates a 3D print profile 150 containing optimized 3D print parameters for the particular 3D printer hardware 110 being used. The input 132 can include the 3D geometry of the object to be 3D printed, a specified 3D printing technique corresponding to the particular 3D printer hardware 110, material being used for the 3D print job, and an application. Inputs can include user selection of one or more critical features of a model, such as mating features, threaded features, high detail features and high tolerance features, time required to 3D print the model, required surface quality, required material properties such as strength, stiffness, yield, elasticity, elongation, electrical conductivity, thermal conductivity, etc., and selection of different material properties for different sections of the part. Applications can range from aerospace, automotive, medical, dental, jewelry, consumer, etc. Note that the systems and techniques described herein are not limited to any one 3D printing technology or material. Moreover, data formats can include surface meshes, solids, volumes, and slices.

The model analytics component 122 can create the 3D print profile 150 by exchanging print job data 142 with a database 140 and communicating with a fault analysis component 124 of the software 120. The fault analysis component 124 can exchange information 134 with the user 130, including fault notification(s) and failure modes information. The fault analysis component 124 can also exchange print job data 144 with the database 140 and correlate print success or failure with the data stored in the database 140 to optimize the model analytics 122 and generation of the 3D print profile 150. The database can include 3D geometry data, 3D print profile data, embedded sensor output data 152, and user input 134 of failure modes. In addition, the fault analysis component 124 can detect hardware failure and determine when the next scheduled maintenance is required.

Figure 2:
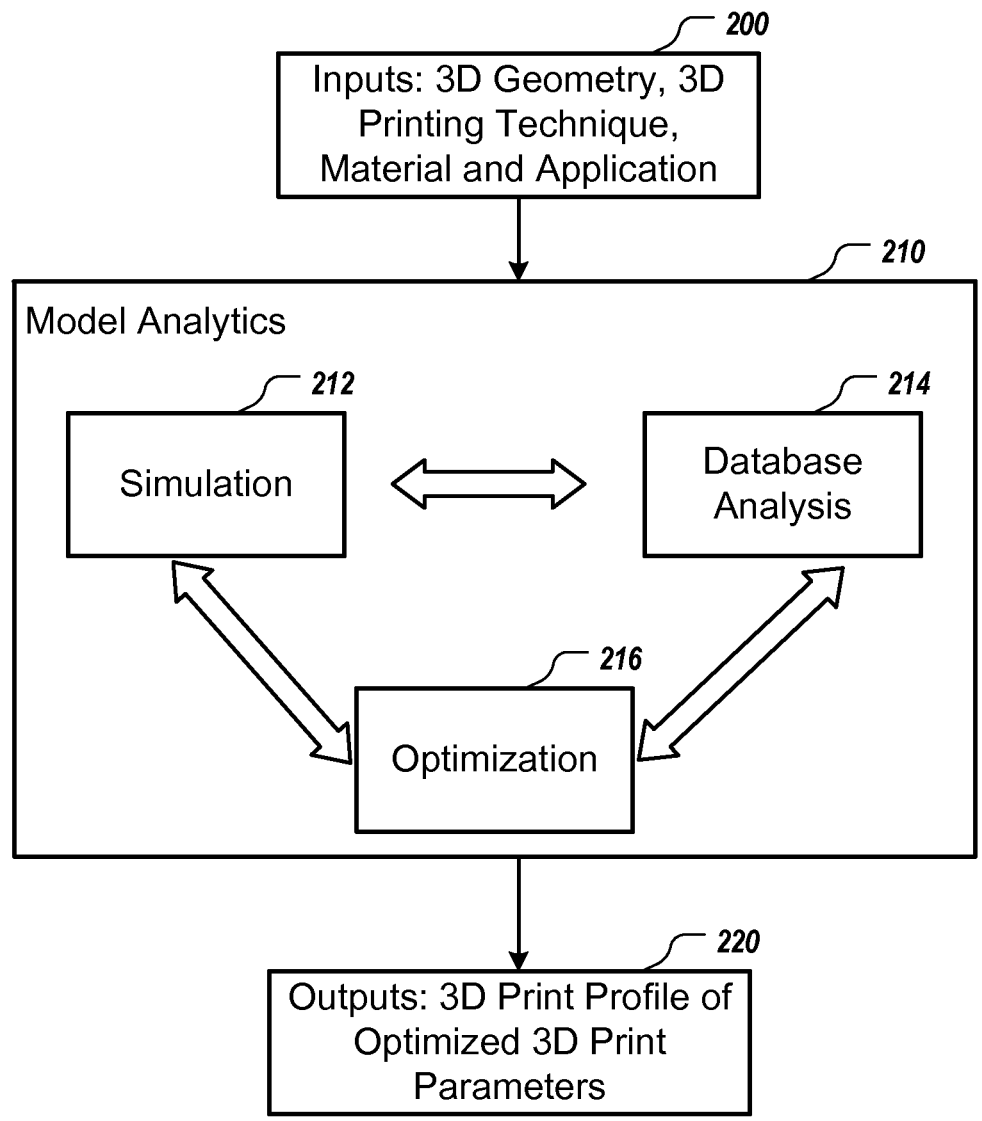
FIG. 2 shows an overview of an example of a process to perform model analytics.

FIG. 2 shows an overview of an example of a process to perform model analytics. As noted above, model analytics software 210 can receive inputs 200 that include 3D geometry, 3D printing technique, material, and application. The model analytics software 210 can perform optimization 216 of output 220, which includes a 3D print profile of optimized 3D print parameters, using simulation 212 and database analysis 214. The user inputs 200 of 3D geometry, 3D printing technique, material and application can be used to create a simulation 212 of the 3D print and to search a preexisting database of previous simulations and 3D prints for similar inputs. The output 220 of the model analytics is a 3D print profile containing the optimized 3D print parameters for the specific 3D print.

Figure 3:
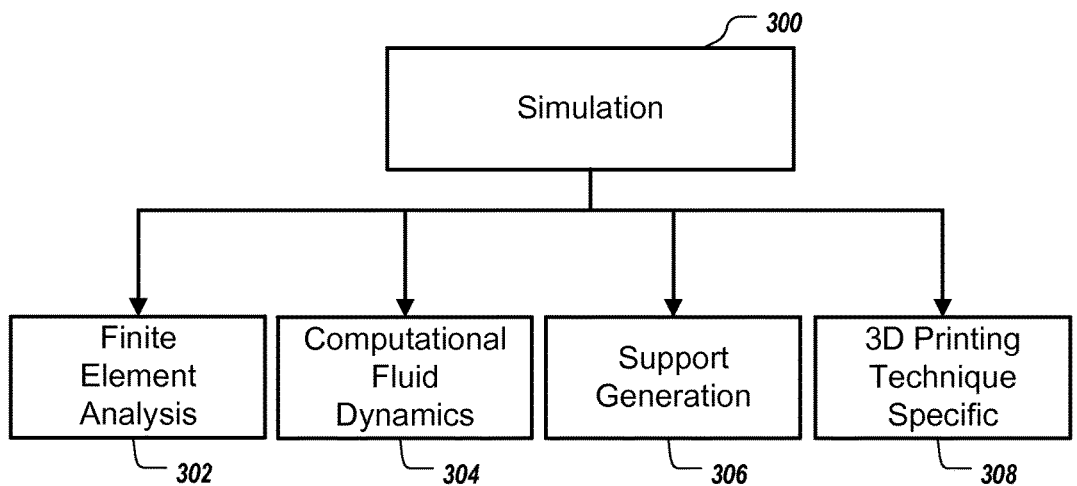
FIG. 3 shows an overview of simulation techniques that can be selected for use in optimizing 3D print parameters.

FIG. 3 shows an overview of simulation techniques that can be selected for use in optimizing 3D print parameters. The simulation 300 of the 3D print is conducted to create a 3D print profile. The simulation 300 can occur on the 3D printer itself, on a user's directly connected personal computer ("PC"), on a local computer connected by a Local Area Network ("LAN") or using cloud computing. The simulation 300 performed can be selected from a group including finite element analysis 302, computational fluid dynamics 304, support generation 306, and one or more additional 3D printing technique specific simulations 308. Note that more than one of these different simulations 302, 304, 306, 308 can be used in the same simulation 300 of a 3D print.

The contents of the 3D print profile can be specific to the 3D geometry, 3D printing technique, material and application. A typical 3D print profile consists of, but is not limited to, a force profile, a thermal profile, and a support profile. The 3D print profile can also contain profiles specific to the 3D printing technique being used. The generation of a force profile can use Finite Element Analysis (FEA) 302 to analyze the 3D geometry during a print to determine the maximum allowable stresses and after a print to determine the part strength. The generation of a thermal profile can use Computational Fluid Dynamics (CFD) 304 to analyze the 3D geometry during a print to determine the thermal expansion and contraction rates. The generation of a support profile can use a Support Generation Algorithm (SGA) 306 to analyze the 3D geometry to determine features that require support material.

In addition, an example of a 3D printing technique specific simulation 308 in Digital Light Processing Stereolithography (DLP SLA) can be a Layer Cure Model to simulate curing conditions and eliminate through cure. Another example can be the use of a Oxygen Content Software Simulation to simulate the diffusion of oxygen during the print to reduce adhesion forces. The results of these simulations can result in the output of a series of 3D print parameters. The 3D print parameters typically include but are not limited to ambient conditions (temperature, humidity, pressure), build speed, material conditions (temperature, viscosity), layer thickness and power profiles.

Referring again to FIG. 2, for database analysis 214, the inputs of 3D geometry, 3D printing technique, material and application can be cross referenced in a database that contains previous 3D geometries, simulations, 3D print profiles and user feedback on the success or failure of the print. The output 220 can be a series of 3D print parameters based on historic data. Note that the series of 3D print parameters can be more than one set of parameters created for the 3D print, where the different sets of parameters are selectable for use at different times of the 3D print and/or based on other criteria. For example, the system can be designed to switch from one set of parameters to another in the 3D print profile based on active feedback from the embedded sensors. For any given 3D print, there can be multiple sets of 3D print parameters in the one 3D print profile for that 3D print, depending on the objectives of the user.

An optimization process 216 can be carried out between the 3D print parameters generated by the simulation 212 and database analysis 214 to determine the optimal 3D print profile. For example, the FEA and support generation simulations can work in tandem to optimize the orientation of the model in order to minimize stresses experienced during the printing process and the amount of support material required.

Figure 4:
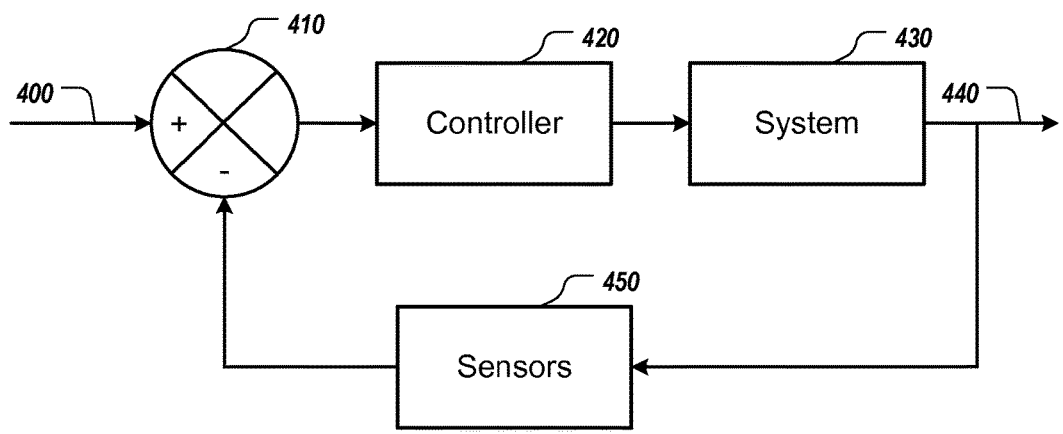
FIG. 4 shows an example of a closed-loop feedback technique to dynamically alter a 3D print profile.

FIG. 4 shows an example of a closed-loop feedback technique to dynamically alter a 3D print profile. During a 3D print, a closed-loop feedback system can be used to dynamically alter the 3D print profile 400 and print parameters in response to sensor input. This serves to increase the print success rate by reducing deviation for the optimized print profile. A controller 420 causes a 3D printer system 430 to provide its output 440 for a 3D print, and this output 440, as well as the in-progress 3D print itself, can be monitored by sensors 450. Feedback from the sensors 450 can be combined 410 with the 3D print profile 400 to actively adjust the operation of the controller 420.

For example, a strain gauge embedded in a DLP SLA system can measure the normal force exerted on a part during printing by adhesion to the window. If this normal force approaches the maximum allowable stress determined in the model analytics, the onboard controller can reduce the force by slowing the build speed. The controller 420 in the closed-loop feedback can be a Proportional Integral Derivative (PID) controller.

A variety of sensors 450 can be embedded within the system that measure print parameters. Sensors can include, but are not limited to, temperature sensor(s) to measure ambient and material temperatures, humidity sensor(s), pressure sensor(s), strain gauges to measure compressive, tensile, shear, bending and torsional stresses during print, imaging system(s), video capture system(s), and thermal imaging system(s).

Referring again to FIG. 1, the database 140 can store every 3D geometry, 3D print profile, sensor output, and simulation along with user input on success and failure and failure modes of multiple 3D prints. As more data is received over time by the database 140, the fault analysis 124 can continually improve the model analytics 122 and the resulting 3D print profiles 150. Note that the database 140 can be local, server based in the cloud or local.

The fault analysis component 124 can employ machine learning algorithms, which can be implemented on the onboard computer 112, a local server or in the cloud. Such machine learning algorithms can analyze the database 140 for trends that link the outcome of 3D prints with specific 3D geometries, 3D print profiles, materials and/or applications. User feedback on the success or failure of the print and the quality of the part can be solicited and used in the feedback loop. Once trends are identified this information can be fed back into the model analytics 122 to improve the analytical model.

An example of implementation of machine learning in DLP SLA can be correlating time to print with support geometry and print success for a given 3D geometry such as a ring. By examining the 3D geometries stored in the database 140 and the user feedback on the success of prints and time to remove supports, the support generation algorithm can be optimized to minimize the support material generated. In addition, the knowhow of one or more experienced users can be utilized to accelerate the optimization process. For example, an experienced user often manually creates support geometry to minimize the removal time. By selectively analyzing the prints of the experienced users, the optimization of support geometry generation can be accelerated. In some implementations, data can be shared across a network (e.g., the Internet) such that actions taken by an experienced user at one location can be used to improve the 3D print profile generated for a different user at a different location that happens to be printing a similar 3D object.

In addition, another function of the fault analysis 124 is to detect trends that are systematic of a hardware fault by analyzing the data stored in the database. When these trends are detected the user can be notified 134 and a maintenance program can be suggested.

Figure 5:
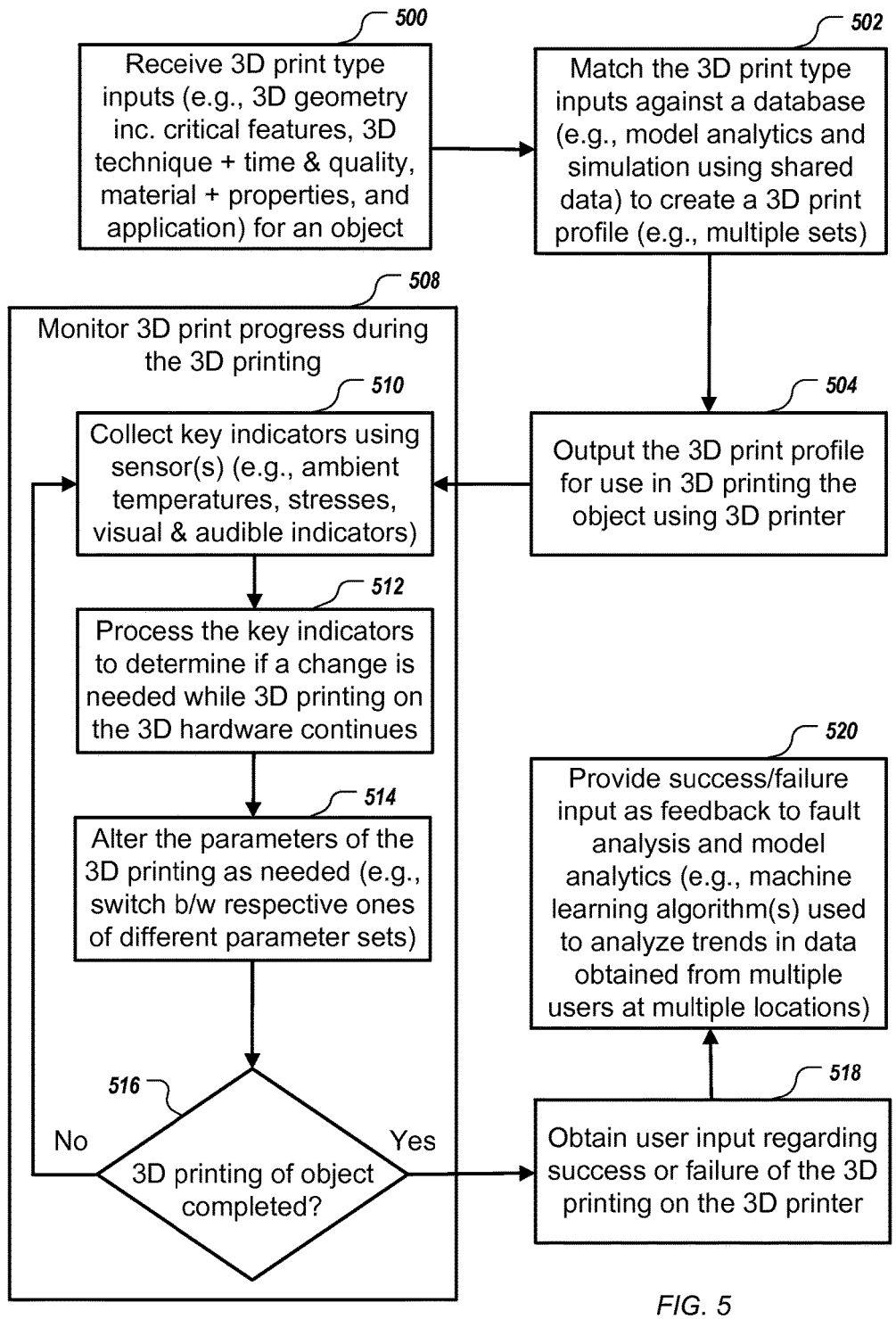
FIG. 5 shows an example of a method of intelligent 3D printing through optimization of 3D print parameters.

FIG. 5 shows an example of a method of intelligent 3D printing through optimization of 3D print parameters. At 500, 3D print type inputs for an object to be 3D printed are received. This can involve presenting a user interface (e.g., on the 3D printer or a computing device communicatively coupled therewith) through which the inputs can be entered, or receiving the inputs from another program. The inputs can include 3D geometry for the object to be 3D printed, including potentially critical features of a 3D model of the object, such as mating features, threaded features, high detail features and high tolerance features.

The inputs can also include the 3D printing technique to be used, which can be determined previously based on the 3D printer that is selected for the 3D printing. Note that in general, the print type inputs can include user inputs, automatically generated inputs, or a combination of these. For example, the types of materials that can be used in the printing can be specified by the 3D printer to be used, but even so, the 3D printer can offer a range of possible materials from which the user can select one or more specific materials for the 3D print. In some implementations, the 3D print type inputs can include the time required to 3D print the model, required surface quality, required material properties, such as strength, stiffness, yield, elasticity, elongation, electrical conductivity, thermal conductivity, etc., or a combination of these. Further, the 3D print type inputs can include the application for the object (e.g., aerospace, automotive, medical, dental, jewelry, etc.) which can in turn provide further details for the 3D print type inputs.

At 502, the 3D print type inputs can be matched against a database to create a 3D print profile including parameters for 3D printing the object using 3D printer hardware. This can include performing model analytics to optimize the parameters in the 3D print profile using simulation of the 3D printing and analysis of previous simulation data retrieved from a database for prior 3D prints for similar 3D print type inputs. For example, the 3D print type inputs can be cross referenced in the database, which contains previous 3D geometries, simulations, 3D print profiles and user feedback on the success or failure of previous 3D prints. The simulations can be selected, as described above, and the use of prior user feedback can provide historic data useable to optimize the parameters for 3D printing. Note that this historic data can include shared user feedback data revealing the success or failure of 3D prints occurring on widely distributed 3D printer hardware. Thus, the database can include both a local component and a remote component, and the method can include sharing data between the local database component and the remote database component across a network such that actions taken by an experienced user at one location can be used to improve the 3D print profile generated for a different user at a different location.

Moreover, the 3D print profile can include multiple different sets of two or more 3D print parameters, which are added at 502 and can then be used during the 3D printing. At 504, the 3D print profile is output for use in 3D printing the object using 3D printer hardware. During the 3D printing, 3D print progress can be monitored at 508. This can involve collecting key indicators using one or more sensors in the 3D printer at 510. The key indicators can include ambient machine, part and raw material temperatures. The key indicators can include compressive, tensile, shear, bending and torsional stresses. In addition, the key indicators can include visual indicators captured via one or more cameras and audible indicators captured via one or more microphones. Note that the types of monitored indicators can vary with the 3D printing technique being used for 3D printing a given object.

The key indicators of 3D print progress can be processed at 512 to determine if a change is needed while the 3D printing on the 3D printer hardware continues. If a change is needed, the 3D printer parameters can be altered at 514. As noted above, this can be a dynamic alteration that occurs, during 3D printing of the object using the 3D printer hardware, responsive to data received from the one or more sensors in the 3D printer hardware arranged in a closed-loop feedback configuration with a 3D print engine. In some implementations, the altering involves switching between respective ones of the different sets of two or more 3D print parameters during 3D printing of a single object using the 3D printer hardware. Thus, the 3D print profile created for the 3D print job can include a series of different parameter sets that can be used as needed (e.g., moving ahead or back in the series) during the 3D printing, where the series has been previously generated to handle different events that may occur during the 3D printing.

A check is made at 516 to see if the 3D printing has completed. Once the 3D print is done, user input regarding success or failure of the 3D print can be obtained at 518. This can be done through a user interface (e.g., on the 3D printer or a computing device communicatively coupled therewith) and can include either a Boolean input or more detailed input information (e.g., gradations of quality between complete success and total failure and/or details of points in time of the printing or locations on the object where the 3D printing result was not adequate). In any case, this success/failure input can be provided at 520 as feedback to the fault analysis and the model analytics (e.g., using machine learning algorithm(s) to analyze trends over many 3D prints, e.g., as performed by one user or multiples users). In some implementations, the fault analysis process can employ one or more machine learning algorithms to analyze the database for trends that link outcomes of 3D prints with specific 3D geometries, 3D print profiles, materials or applications, and this analysis can be used to improve future model analytic processes and 3D print profiles.

Figure 6:
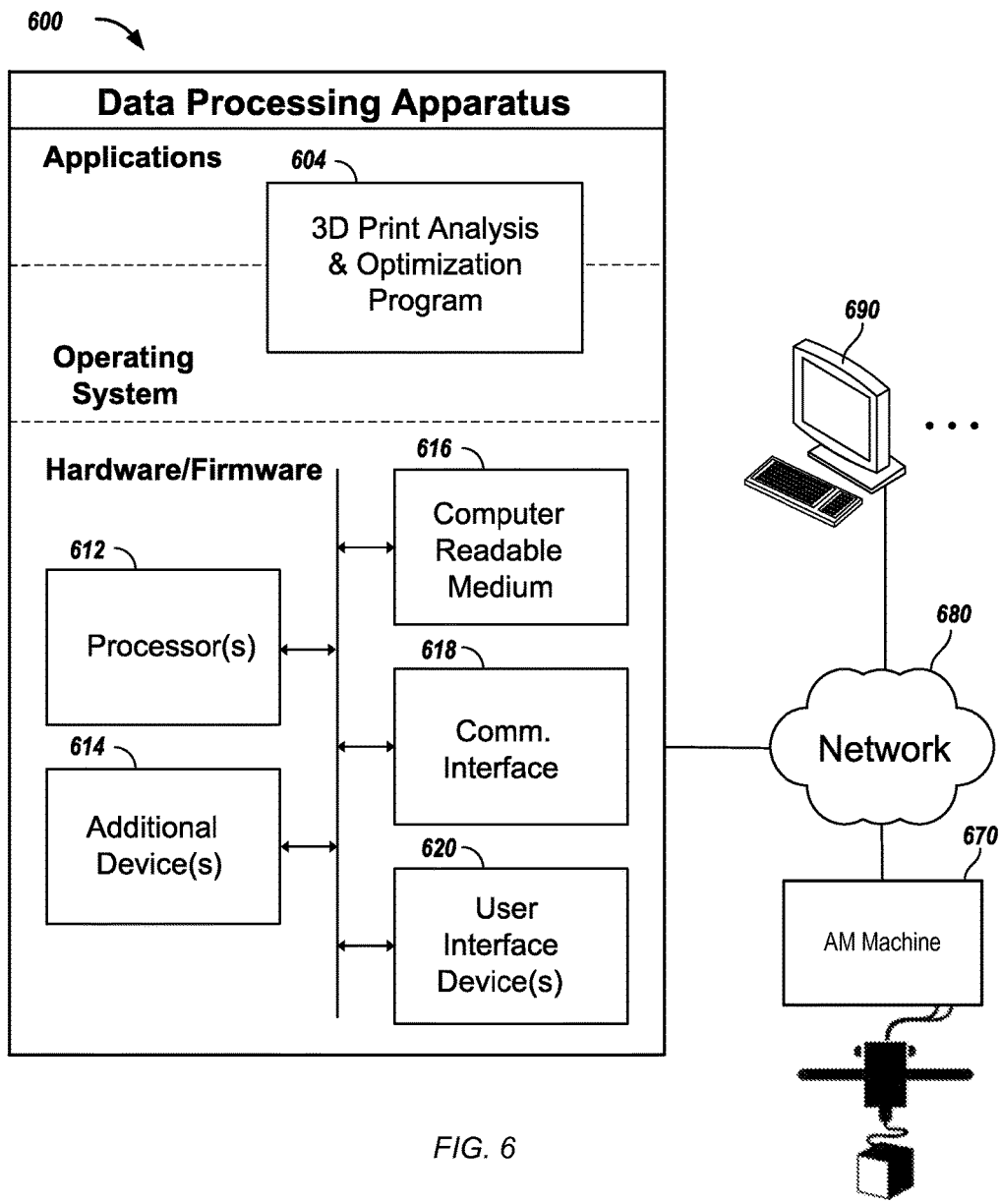
FIG. 6 is a schematic diagram of a data processing system.

FIG. 6 is a schematic diagram of a data processing system including a data processing apparatus 600, which can be programmed as a client or as a server. The data processing apparatus 600 is connected with one or more computers 690 and an additive manufacturing (AM) machine 670 through a network 680. While the AM machine 670 is represented as an FDM 3D printer, it will be appreciated that many different types of 3D printers can be used. Moreover, while only one computer is shown in FIG. 6 as the data processing apparatus 600, multiple computers can be used, and various levels of integration can be employed. For example, in some implementations, the data processing apparatus 600 and the AM machine 670 are integrated together in a single 3D printer device (e.g., a desktop 3D printer device). As another example, the AM machine 670 can be connected with a LAN 680, which is further connected with the one or more computers 690 through the Internet, and multiple PCs 600 can be connected to the LAN 680 and have access to the AM machine 670 for 3D printing.

The data processing apparatus 600 includes various software modules, which can be distributed between an applications layer and an operating system. These can include executable and/or interpretable software programs or libraries, including tools and services of a 3D print analysis & optimization program 604, such as described above. The number of software modules used can vary from one implementation to another. Moreover, the software modules can be distributed on one or more data processing apparatus connected by one or more computer networks or other suitable communication networks.

The data processing apparatus 600 also includes hardware or firmware devices including one or more processors 612, one or more additional devices 614, a computer readable medium 616, a communication interface 618, and one or more user interface devices 620. Each processor 612 is capable of processing instructions for execution within the data processing apparatus 600. In some implementations, the processor 612 is a single or multi-threaded processor. Each processor 612 is capable of processing instructions stored on the computer readable medium 616 or on a storage device such as one of the additional devices 614. The data processing apparatus 600 uses its communication interface 618 to communicate with one or more computers 690, for example, over a network 680. Examples of user interface devices 620 include a display, a camera, a speaker, a microphone, a tactile feedback device, a keyboard, and a mouse. The data processing apparatus 600 can store instructions that implement operations associated with the modules described above, for example, on the computer readable medium 616 or one or more additional devices 614, for example, one or more of a floppy disk device, a hard disk device, an optical disk device, a tape device, and a solid state memory device.

Embodiments of the subject matter and the functional operations described in this specification can be implemented in digital electronic circuitry, or in computer software, firmware, or hardware, including the structures disclosed in this specification and their structural equivalents, or in combinations of one or more of them. Embodiments of the subject matter described in this specification can be implemented using one or more modules of computer program instructions encoded on a computer-readable medium for execution by, or to control the operation of, data processing apparatus. The computer-readable medium can be a manufactured product, such as hard drive in a computer system or an optical disc sold through retail channels, or an embedded system. The computer-readable medium can be acquired separately and later encoded with the one or more modules of computer program instructions, such as by delivery of the one or more modules of computer program instructions over a wired or wireless network. The computer-readable medium can be a machine-readable storage device, a machine-readable storage substrate, a memory device, or a combination of one or more of them.

The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, a runtime environment, or a combination of one or more of them. In addition, the apparatus can employ various different computing model infrastructures, such as web services, distributed computing and grid computing infrastructures.

A computer program (also known as a program, software, software application, script, or code) can be written in any form of programming language, including compiled or interpreted languages, declarative or procedural languages, and it can be deployed in any form, including as a stand-alone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub-programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto-optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device (e.g., a universal serial bus (USB) flash drive), to name just a few. Devices suitable for storing computer program instructions and data include all forms of non-volatile memory, media and memory devices, including by way of example semiconductor memory devices, e.g., EPROM (Erasable Programmable Read-Only Memory), EEPROM (Electrically Erasable Programmable Read-Only Memory), and flash memory devices; magnetic disks, e.g., internal hard disks or removable disks; magneto-optical disks; and CD-ROM and DVD-ROM disks. The processor and the memory can be supplemented by, or incorporated in, special purpose logic circuitry.

To provide for interaction with a user, embodiments of the subject matter described in this specification can be implemented on a computer having a display device, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input.

The computing system can include clients and servers. A client and server are generally remote from each other and typically interact through a communication network. The relationship of client and server arises by virtue of computer programs running on the respective computers and having a client-server relationship to each other. Embodiments of the subject matter described in this specification can be implemented in a computing system that includes a back-end component, e.g., as a data server, or that includes a middleware component, e.g., an application server, or that includes a front-end component, e.g., a client computer having a graphical user interface or a Web browser through which a user can interact with an implementation of the subject matter described is this specification, or any combination of one or more such back-end, middleware, or front-end components. The components of the system can be interconnected by any form or medium of digital data communication, e.g., a communication network. Examples of communication networks include a LAN and a wide area network ("WAN"), an inter-network (e.g., the Internet), and peer-to-peer networks (e.g., ad hoc peer-to-peer networks).

While this specification contains many implementation details, these should not be construed as limitations on the scope of the invention or of what may be claimed, but rather as descriptions of features specific to particular embodiments of the invention. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Thus, particular embodiments of the invention have been described. Other embodiments are within the scope of the following claims. In addition, the actions recited in the claims can be performed in a different order and still achieve desirable results.

What is claimed is:

1. A system comprising:
   three dimensional (3D) printer hardware; and
   at least one computer communicatively coupled with the 3D printer hardware, the at least one computer programed to receive 3D print type inputs for an object to be 3D printed and create a 3D print profile comprising parameters for 3D printing the object using the 3D printer hardware by matching the 3D print type inputs against a database;
   wherein the at least one computer is programed to perform model analytics to optimize the parameters in the 3D print profile using simulation of the 3D printing and analysis of previous simulation data retrieved from the database for prior 3D prints having corresponding 3D print type inputs, the at least one computer is programed to select a type of the simulation from a plurality of simulations based on the 3D print type inputs, the 3D print type inputs comprise 3D geometry, a 3D printing technique, a material of the 3D printing, and a specific industry application, and the parameters in the 3D print profile comprise ambient conditions, build speed, material conditions, layer thickness and power profiles; and
   wherein the at least one computer is programed to operate the 3D printer using the optimized parameters in the 3D print profile to increase 3D print success rate, 3D print quality, 3D print speed, or a combination thereof.

2. The system of claim 1, wherein the 3D printer hardware comprises one or more embedded sensors and an onboard computer arranged in a closed-loop feedback configuration with a 3D print engine to dynamically alter 3D print parameters to optimize a 3D print during 3D printing of the 3D print.

3. The system of claim 1, wherein the at least one computer is programed to perform database analysis by cross referencing the 3D print type inputs in the database, which contains previous 3D geometries, simulations, 3D print profiles and user feedback on the success or failure of previous 3D prints, such that the parameters for 3D printing are optimized based on historic data.

4. The system of claim 1, wherein the type of the simulation is at least one selected from finite element analysis, computational fluid dynamics, and support generation.

5. The system of claim 1, wherein the at least one computer is programed to perform model analytics and fault analysis, wherein the fault analysis employs one or more machine learning algorithms to analyze a database for trends that link outcomes of 3D prints with specific 3D geometries, 3D print profiles, materials or specific industry applications, and wherein user feedback regarding success or failure of 3D printing and quality thereof are solicited and used as feedback to the fault analysis and the model analytics.

6. The system of claim 5, wherein the at least one computer comprises an onboard computer of the 3D printer hardware.

7. A method comprising:
   receiving three dimensional (3D) print type inputs for an object to be 3D printed;
   creating a 3D print profile comprising parameters for 3D printing the object using 3D printer hardware by matching the 3D print type inputs against a database; and
   outputting the 3D print profile and causing 3D printing of the object using the 3D print profile with the 3D printer hardware;
   wherein the creating comprises performing model analytics to optimize the parameters in the 3D print profile using simulation of the 3D printing and analysis of previous simulation data retrieved from the database for prior 3D prints having corresponding 3D print type inputs, the method comprises selecting a type of the simulation from a plurality of simulations based on the 3D print type inputs, wherein the 3D print type inputs comprise 3D geometry, a 3D printing technique, a material of the 3D printing, and a specific industry application, and the parameters in the 3D print profile comprise ambient conditions, build speed, material conditions, layer thickness and power profiles.

8. The method of claim 7, wherein the receiving comprises receiving the 3D print type inputs including user selected critical features of a 3D model of the object and material properties of the object to be 3D printed.

9. The method of claim 7, comprising dynamically altering the parameters of the 3D print profile while 3D printing the object using the 3D printer hardware responsive to data received from one or more sensors in the 3D printer hardware arranged in a closed-loop feedback configuration with a 3D print engine.

10. The method of claim 9, wherein the creating comprises adding to the 3D print profile multiple different sets of two or more 3D print parameters, and the altering comprises switching between respective ones of the different sets of two or more 3D print parameters during 3D printing of a single object using the 3D printer hardware.

11. The method of claim 9, comprising monitoring 3D print progress during the 3D printing by collecting and processing key indicators using the one or more sensors in the 3D printer hardware.

12. The method of claim 11, wherein the key indicators comprise:
 ambient machine, part and raw material temperatures;
 compressive, tensile, shear, bending and torsional stresses;
 visual indicators captured via one or more cameras; and
 audible indicators captured via one or more microphones.

13. The method of claim 7, wherein the database includes both a local component and a remote component, and the method comprises sharing data between the local database component and the remote database component across a network such that actions taken by an experienced user at one location are used to improve the 3D print profile generated for a different user at a different location.

14. The method of claim 7, wherein the creating comprises performing database analysis by cross referencing the 3D print type inputs in the database, which contains previous 3D geometries, simulations, 3D print profiles and user feedback on the success or failure of previous 3D prints, such that the parameters for 3D printing are optimized based on historic data.

15. The method of claim 7, wherein the type of the simulation is at least one selected from finite element analysis, computational fluid dynamics, or support generation.

16. The method of claim 7, comprising:
 performing model analytics and fault analysis, wherein the fault analysis employs one or more machine learning algorithms to analyze a database for trends that link outcomes of 3D prints with specific 3D geometries, 3D print profiles, materials or specific industry applications;
 obtaining user input regarding success or failure of 3D printing and quality; and
 using the user input regarding success or failure as feedback to the fault analysis and the model analytics.

\* \* \* \* \*